United States Patent Office 3,386,829

Patented June 4, 1968

3,386,829

PHOTOREPRODUCTION PROCESS UTILIZING PHOTOSENSITIVE THIANTHRENE COMPOSITIONS

Gordon C. Newland, Kingsport, Tenn., assignor to Eastman Kodak Company, Rochester, N.Y., a corporation of New Jersey No Drawing. Filed Mar. 15, 1965, Ser. No. 439,936
5 Claims. (Cl. 96—90)

ABSTRACT OF THE DISCLOSURE

A photosensitive composition comprising, before exposure, a cellulose ester or polyolefin having dispersed therein a photosensitive thianthrene compound which is substantially insensitive to visible light but is permanently transformed from a substantially colorless form into a compound having a visible color upon exposure to ultraviolet radiation.

The present invention relates generally to photosensitive compositions useful in photographic systems and more particularly to photosensitive polymeric compositions, such as synthetic plastics having a photosensitive compound incorporated therein, which on exposure to light of suitable wave length and intensity will provide a permanent image therein without requiring further development, and to a method of photoreproduction using said photosensitive polymeric compositions.

The photographic arts as generally practiced require incorporating a photosensitive compound, usually a silver salt, in a suitable binder or carrier and forming a thin coating thereof on a supporting plastic sheet or base. The multiplicity of steps required to form the conventional photosensitive article and to produce a permanent image therefrom makes the cost of the final product relatively expensive, and it would be highly desirable to provide a suitable photosensitive film or like article in a more direct and economical manner.

It is an object of the present invention to provide a photosensitive polymeric composition capable of being processed directly into a photosensitive film, plate or other article useful for photographic printing, copying, and the like which upon exposure to actinic radiation develops a permanet image therein. It is a further object of the present invention to provide an improved method of photoreproduction which comprises exposing selected portions of a photosensitive polymeric composition to suitable radiation whereby the irradiated portions of the photosensitive composition are transformed from a substantially colorless form to a form having a permanently visible color. Other objects of the present invention will be evident to those skilled in the art from the following detailed description and claims to follow.

I have discovered that certain light sensitive compounds can be incorporated in a plastic material to form a photosensitive plastic composition without impairing either the light sensitivity of the compounds or the stability of the plastic material, and that these photosensitive plastic compositions when formed into photosensitive films, plates and molded articles are useful for photoprinting, copying, and the like. More particularly, the present invention comprises incorporating a photosensitive compound which is substantially insensitive to visible light but sensitive to ultraviolet radiation, and in some instances sensitive to X-rays, into a polymeric plastic material. The plastic material which may be successfully used in my invention is any polymeric plastic material capable of being formed into the desired shape. Examples of such materials would include synthetic plastics formulated from polyolefins, such as polyethylene and polypropylene; fatty acid esters of cellulose, both simple and mixed, such as cellulose acetate and cellulose acetate butyrate; polystyrene; polyamides; polycarbonates; polyurethanes; polyvinyls; polyesters; polyallomers, and like polymer plastics. Any of the known plasticizers can, if desired, be incorporated into the polymeric plastic material to form a composition therewith so as to facilitate forming a desired sheet, film or plate of the photosensitive polymeric composition by any of the conventional methods known to the art without impairing the photosensitivity thereof.

The photosensitive compounds used in the present invention preferably satisfy the requirements of being substantially colorless under normal heat and light conditions, have a low sensitivity to visible light but develop a significant color when exposed to ultraviolet radiation, and should also have the capability of being uniformly dispersed in the polymeric plastic materials and formable into suitable films, plates, and the like by conventional manufacturing procedures without losing their photosensitivity.

Included among the photosensitive compounds having the foregoing properties are the following types of compounds:

A. BENZOIC ACID ESTERS

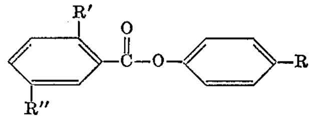

where R, R' and R'' may be either hydrogen, hydroxy, nitro, phenyl, amino, alkyl, alkoxy, aryloxy, cyano, trifluoro methyl, halogen or mercapto.

Examples of which are:

Phenyl benzoate;
p-Methylphenyl 2,4-dimethylbenzoate;
p-Cyanophenyl 2-hydroxy-4-methylbenzoate;
p-Hydroxyphenyl 2-hydroxy-4-methoxybenzoate.

B. NAPHTHOIC ACID ESTERS

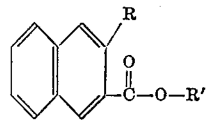

where R is as described above and R' is phenyl substituted as described above or is a p-substituted condensed ring hydrocarbon.

Examples of which are:

Phenyl 1-hydroxy-2-naphthoate;
p-Methylphenyl 1-hydroxy-2-naphthoate;
p-Phenoxyphenyl 1-methyl-2-naphthoate;
α-Naphthyl 1-methyl-2-naphthoate.

C. 3,3-DIMETHYLINDOLINOBENZOPYRYLOSPIRANS

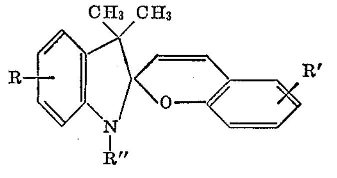

where R and R' are independently chosen from the group: H, OH, halogen, nitro, methoxy or aryloxy, and R'' is H or alkyl where the number of carbon atoms can be varied from 1 to 20.

Examples of which are:

1,3,3-trimethylindolinobenzopyrylospiran;
1,3,3-trimethylindolinobenzopyrylospiran;
1,3,3 - trimethylindolino - 6′-methoxy-8′-nitrobenzopyrylospiran;
1,3,3 - trimethyl - 5-nitroindolino-8′-methoxy-6′-nitrobenzopyrylospiran.

D. THIANTHRENES

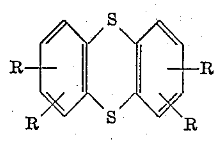

where R is independently chosen from the group consisting of H, OH, SH, $NO_2$, alkyl, alkoxy, carboxy or carbamyloxy.

Examples of which are:

2,3,7,8-tetramethylthianthrene;
2,7-dinitrothianthrene;
2,3,7,8-tetramethoxythianthrene;
2,3-dihydroxythianthrene.

E. MODIFICATIONS OF 4-($\beta$-HYDROXY-$\omega$-NITROSTYRENE)

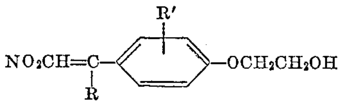

where R is H or hydroxy and R′ is nitro.

Examples of which are:

4-(2-hydroxyethoxy)-2-nitro-$\alpha$-(nitromethylene)-benzyl alcohol;
2-[3-nitro-4-(2-nitrovinyl)phenoxy]ethanol;
4 - (2 - hydroxyethoxy)-3-nitro-$\alpha$-(nitromethylene)-benzyl alcohol;
2-[2-nitro-4-(2-nitrovinyl)phenoxy]ethanol.

F. MODIFICATIONS OF 6-NITROPIPERONYLIDENE-p-TOLUIDINE

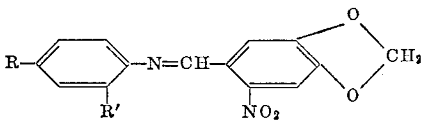

where R is H, alkyl or alkoxy having 1 to 20 carbon atoms and R′ is nitro or nitroso.

Examples of which are:

6-nitropiperonylidene-p-toluidine;
4-methyl-2-nitro-N-[5-nitro-1,2-(methylenedioxy)phenyl] methylene aniline;
4-tert-butyl-2-nitroso-N-[5-nitro-1,2-(methylenedioxy) phenyl]methylene aniline;
4-(1,1,3,3-tetramethylbutyl)-2-nitro-N-[5-nitro-1,2-(methylenedioxy)phenyl]methylene aniline.

G. MODIFICATIONS OF 4-(2-NITROPHENYL)-4-HYDROXY-2-BUTANONE

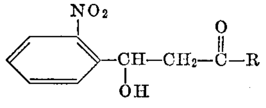

where R is an alkyl radical having 1 to 20 carbon atoms, a phenyl group having substituents in the o-position such as H or OH and may also be p-substituted with alkyl, alkoxy or aryloxy groups.

Examples of which are:

4-hydroxy-4-(o-nitrophenyl)-2-butanone;
1-hydroxy-1-(o-nitrophenyl)-3-heptanone;
3-hydroxy-3-(o-nitrophenyl)propiophenone;
3-hydroxy-2′-hydroxy-4′-methoxy-3-(o-nitrophenyl) propiophenone.

H. POLYSUBSTITUTED BENZENES

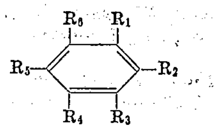

where $R_1$–$R_6$, inclusive, are independently chosen from the group of nitro, alkyl, alkoxy and aryloxy, where the alkyl and alkoxy radicals have 1 to 20 carbon atoms.

Examples of which are:

1,2-dimethoxy-4,5,6-trinitrobenzene;
1,3,5-trimethoxy-2,4,6-trinitrobenzene;
6-methoxy-2,3,4-trinitrophenyl phenylether;
1,4-didodecyloxy-2,5-dinitrobenzene.

I. N-PHENYLACRIDONES

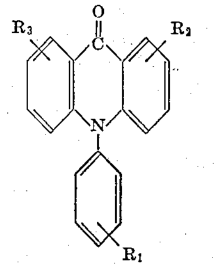

where $R_1$, $R_2$, $R_3$ are independently chosen from the group of alkyl and alkoxy having 1 to 20 carbon atoms, arloxy, nitro, hydrogen, hydroxy, halogen and nitroso.

For example: N-phenylacridone.

J. 4-QUINOLIZONES

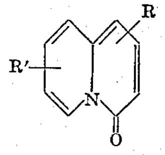

where R and R′ are chosen from the group of alkyl, alkoxy, nitro, hydrogen, hydroxy, nitroso and aryloxy.

For example: 4-quinolizone.

K. 4,4″-OXYDIBENZOPHENONES

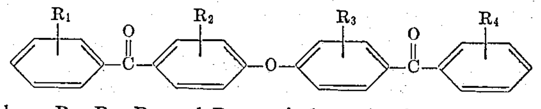

where $R_1$, $R_2$, $R_3$ and $R_4$ are independently chosen from the group of H, SH, OH, alkyl, alkoxy, nitro, nitroso or halogen.

For example: 4,4″-oxydibenzophenone.

L. ACETAMIDOETHYL-3′-NITROBENZILS

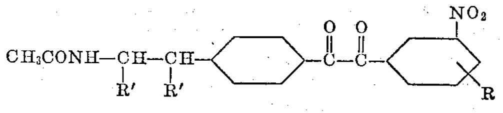

where R is independently chosen from the group of H, OH, SH, $NO_2$, $C_nH$ $(2n+1)$, $OC_nH$ $(2n+1)$ (where $n=1$ to 20) and aryl or aryloxy and where R′ is 3,5 - bis (carbomethoxy)phenoxy or is independently chosen from the groups listed for R.

For example: 4 - $\beta$,$\alpha$ - [3,5 - bis(carbomethoxy)phenoxy]acetamidoethyl-3′-nitrobenzil.

M. THIOSALICYLATES

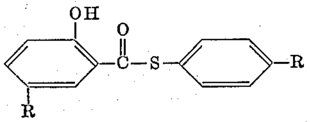

where R is alkyl, alkoxy, nitro, amino, or hydrogen.

Examples of which are:

S-phenyl thiosalicylate;
S-p-nitrophenyl thiosalicylate;
S-p-tert-butylphenyl thiosalicylate;
S-phenyl-5-nitrothiosalicylate.

N. DITHIOBENZOATES

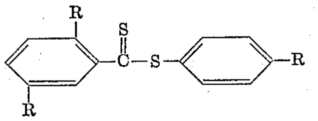

where R is alkyl, alkoxy, nitro, phenyl, amino, cyano, hydroxy, mercapto, and hydrogen.

Examples of which are:

Phenyl dithiobenzoate;
p-Methylphenyl dithiobenzoate;
p-Nitrophenyl dithiobenzoate;
p-Aminophenyl dithiobenzoate.

O. THIOBENZOIC ACID ESTERS

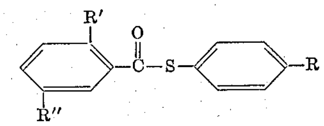

where R, R', and R'' may be either hydrogen, nitro, hydroxy, phenyl, amino, alkyl, alkoxy, aryloxy, cyano, trifluoromethyl, halogen, or mercapto.

For example: Phenyl thiobenzoate.

P. 5-NITROSALICYCLIC ACID

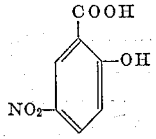

Q. 2-HYDROXY-4-NITRONAPHTHOIC ACID

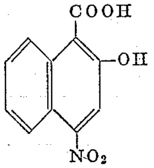

The photosensitive compounds of the present invention can be admixed with the plastic material in any of the conventional methods known to the art for compounding plastic materials. For example, the photosensitive compound can be directly incorporated into the plastic material by hot-roll mixing or compounding, preferably under a nitrogen atmosphere, after which the plastic mixture containing the photosensitive compound is granulated and molded into the desired film or sheet. If desired, the photosensitive compound can be dissolved in a solvent, or the plastic material can be diluted with a solvent which also dissolves the photosensitive compound. The method by which the photosensitive compound is incorporated in the plastic material does not form a part of the present invention, and any suitable method can be used.

And, while the amount of photosensitizing compound used in the plastic material depends on the effectiveness of the particular compound used, the concentration thereof will range between about 0.01 percent and 50 percent by weight of the plastic material and preferably from about 0.1 to 10.0 percent.

Where the photosensitive plastic film or sheet material is to be used in a photocopying process, as where it is desired to copy printed material, pictures or the like, it may be desirable to add to the normally substantially colorless or translucent photosensitive plastic material a filler which provides a background or contrast with the color of the radiated photosensitive material.

Filler materials which can be used include conventional filler pigments, such as titanium oxide, zinc oxide, zirconium oxide and the like pigments commonly used as fillers in plastic articles.

As the photosensitive compounds used to form the photosensitive polymeric material of the present invention are substantially unaffected by prolonged exposure to visible light rays, the photosensitive polymeric compositions of the present invention can be stored and handled without special precautions to exclude visible light and need not be used or processed in conventional dark rooms. It is thus possible to use the photosensitive polymeric compositions of the present invention in a photocopying process where the photosensitive polymeric material in sheet form is exposed to a source of ultraviolet radiation while portions of the sheet are shielded by a negative or other material to be copied. After exposure to a source of ultraviolet radiation, such as that produced by a Hanovia lamp, for a period bearing from about 1 minute to 60 minutes, the intensity of the color developed varies with the particular concentration of photosensitive compound in the polymeric material as well as with the intensity and duration of the ultraviolet radiation to which the material is exposed. Also, a variety of colors can be produced by exposure to ultraviolet radiation varying from yellow, orange, brown, blue and black by selection of the particular photosensitive compound for incorporation in the polymeric material.

In order to further illustrate the present invention without limiting the invention to the particular plastic materials, photosensitive compounds, or conditions used, the following specific examples are given.

Example 1

Cellulose acetate butyrate was hot-roll compounded with 12 parts dibutyl sebacate per 100 parts polymer and 1 part of p-hydroxyphenyl-o-hydroxybenzoate. Flat plates 10-mils thick were compression molded from the roll slabs at 325° F. Sections cut from this film were exposed behind a grid to a Hanovia lamp for 10 minutes and 30 minutes. The compositions were clear and colorless as molded. After exposure to ultraviolet radiation, the sections which were irradiated were yellow in color. The unexposed areas were still clear and colorless. A clear distinct pattern of the grid was clearly visible. The color of the 10-minute exposure was light yellow; the 30-minute exposure was more intense.

The above example illustrates the use of the invention wherein cellulose acetate butyrate is the plastic medium for the photosensitive compound. The method of preparation or incorporation of the photosensitive compound in the plastic is one which is widely used in the trade. The method is not thought to be restricted in that any suitable plastic compounding or method of incorporating the additive in the plastic would be satisfactory.

Example 2

Various benzoates and related compounds to be tested for photosensitivity were compounded with cellulose acetate butyrate as described in Example 1. Dibutyl sebacate was used as the plasticizer at a concentration of 12 parts per 100 parts polymer. Films compression molded from the roll slabs were irradiated 10 minutes with a Hanovia lamp while behind a grid. The compounds tested and the results of the tests are summarized in Table 1.

TABLE 1

| Photosensitive Additive at a Concentration of 1 Part/Hundred | Results of Phototest |
|---|---|
| None | No printing. |
| p-Hydroxyphenyl-o-hydroxybenzoate | Good detail, yellow color. |
| o-Hydroxyphenyl-o-methoxybenzoate | Good detail, light yellow color. |
| Catechol-mono-p-hydroxybenzoate | Do. |
| p-Hydroxyphenyl-1-hydroxynaphthoate | Good detail, deep yellow color. |
| p-Hydroxyphenyl-2, 5-dihydroxybenzoate | Do. |
| 5-nitrosalicylic acid | Do. |
| p-Nitrophenyl salicylate | Do. |
| p-Nitrophenyl-5-nitrosalicylate | Do. |
| Phenyl ester of thiobenzoic acid | Good detail, brown color. |
| m-Hydroxyphenyl-p-hydroxybenzoate | No printing. |
| Resorcinol dibenzoate | Do. |
| m-Methoxyphenylbenzoate | Do. |

It should be noted that the color formed on exposure to ultraviolet radiation was found to be stable to further exposure. Specimens of the cellulose acetate butyrate which had been colored by exposure to a Hanovia lamp were also exposed to artificial weathering in an Atlas Weather-Ometer, type XWR for 2000 hours without significant fading of the yellow color.

Example 3

The compositions to be tested were compounded with cellulose acetate butyrate as described in Example 2. One percent titanium IV oxide was incorporated as a filler for background. Films, compression molded from the roll-compounded compositions, were exposed behind a grid to a Hanovia lamp for 2, 4, 10, 15, and 60 minutes. The results of the test and the compositions tested are summarized in Table 2.

TABLE 2

| Photosensitive Additive | Concentration, Parts/100 | Results of Exposure | | | | |
|---|---|---|---|---|---|---|
| | | 2 Min. | 4 Min. | 10 Min. | 15 Min. | 60 Min. |
| None | | No effect | No effect | No effect | No effect | No effect. |
| p-Hydroxyphenyl-o-hydroxybenzoate. | 1 | Light Yellow, poor detail. | Yellow, good detail. | Bright Yellow, good detail. | Bright Yellow, good detail. | Bright Yellow, good detail. |
| Do | 3 | Light Yellow, fair detail. | do | do | do | Do. |
| Phenyl thiosalicylate | 1 | | | | Fair detail, Light Brown. | Good detail, Yellow-Brown. |
| p-Nitrophenyl salicylate | 1 | | | | Poor detail, Light Brown. | Good detail, Brown. |

Example 4

Thianthrene was dissloved into a 5 percent dope of polypropylene in 1,2,3,4-tetrahydronaphthalene at a concentration level of 5 percent based on the weight of the polypropylene. The dope containing the thianthrene was heated at 145° C. for 30 minutes and thianthrene was thus mixed with the polypropylene. The dope containing the additive was cast upon a ferrotype plate heated at 143° C., and the 1,2,3,4-tetrahydronaphthalene evaporated to leave a 3-mils thick film of the polypropylene containing the additive. The film was quenihed in cold water and peeled from the ferrotype plate. Sections cut from the film thus prepared were exposed to a Hanovia ultraviolet lamp for 2, 10, and 20 minutes. Parts of the specimen were shielded from the radiation by an opaque grid. At the end of the 2-minute exposure, the areas of the film which were not shielded from the radiation were brown in color and a clear pattern of the grid was visible. The specimen exposed for 10 minutes had a black pattern of the grid. The specimen exposed for 20 minutes was also black, but the intensity was about the same as that for the 10-minute exposure.

Example 5

Polypropylene of melt index 4.5 was compounded with the photosensitive compounds 1,3,3-trimethylindolino-6′-nitro - 8′-methoxybenzopyrylospiran and 1,3,3-trimethylindolino-6′-nitrobenzopyrylospiran as described in Example 1. Compression molded films of these compositions were exposed for 5 minutes to the emission X-rays of a tungsten target at 50 kvp. 40 ma. in the standard spectrogoniometer sample holder. The compositions as compression molded were clear, colorless films. After the exposure to X-rays, the films containing the 1,3,3-trimethylindolino - 6′ - nitro-8′-methoxybenzopyrylospiran developed a deep blue color where irradiated. The composition containing 1,3,3 - trimethylindolino - 6′ - nitrobenzopyrylospiran developed a red color where irradiated. The unirradiated films remained colorless in both cases. Heating the films to temperatures in excess of 60° C. reversed the process and again produced a clear, colorless film. The process was repeated for three cycles without any visible change in the intensity of the color formed or the speed of the coloration or fading. Similar exposures and reversals of colors were carried out using utlraviolet radiation.

This example illustrates the utility of the composition as X-ray film. It also illustrates the unique feature whereby the image may be erased the film reused. These particular compositions have the disadvantage that they are also sensitive to visible light. However, they are much less sensitive to visible light than to X-rays and ultraviolet radiation; hence, the image may be viewed in subdued light.

Example 6

Polypropylene of melt index 4.5 and inherent viscosity of 1.60 was compounded in a C. W. Brabender Plastograph with 1 percent by weight of the additives to be tested. The compounding was carried out under a nitrogen atmosphere. The resultant mix was granulated and injection molded into tensile specimens 2½ x 2½ inches. Films, compression molded from these tensile specimens, were exposed behind a grid to a Hanovia ultraviolet lamp for 10 minutes. After the exposure to ultraviolet, the specimens were removed and inspected visually for the photoprinting of the grid on the film. The additives tested and the results of the exposure to ultraviolet are summarized in Table 3.

TABLE 3

| Photosensitive Additive at 1% Concentration Level | Results of Phototest |
|---|---|
| None | No printing. |
| Thianthrene | Good detail, brown color. |
| 1,3,3-trimethylindolino-6′-nitro-8′-methoxybenzopyrylospiran. | Good detail, blue color. |
| 1,3,3-trimethylindolino-6′-nitro-benzopyrylospiran. | Good detail, red color. |
| 3,4,5-trinitroveratrol | Good detail, orange color. |
| 6-nitropiperonylidene-p-toluidine | Do. |
| 4-(β-hydroxyethoxy)-α-nitrostyrene | Good detail, fading of yellow color. |
| 4-(2-nitrophenyl)-4-hydroxy-2-butanone. | Good detail, light brown color. |
| N-salicylidene-m-toluidine | No printing. |
| Ferrocene | Do. |
| N,N′-disalicylidenebis (phenylenediamine). | Do. |
| 4,4′-dinitrostilbene | Do. |

While the foregoing specific examples have been primarily concerned with forming photographic films directly by molding a plastic material having a photosensitive compound incorporated therein, it is also within the scope of the present invention to apply a thin coating of the photosensitive polymeric composition of the present invention to a supporting base in accordance with the present photographic practice.

The mode of operation by which the color transformation is effected in the various photosensitive compositions of the present invention is not fully known. However, many of the most effective compounds are characterized by having ketone rearrangement products. These compounds generally have a low color intensity in the ester state and develop a pronounced color in the ketone state. For example, the benzoate compounds may undergo a rearrangement in the following manner:

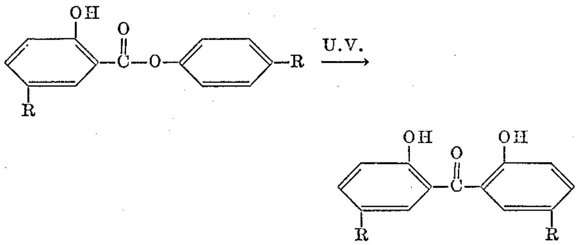

where R is a color contributing group such as hydroxy, nitro, amino, phenyl, alkyl, or alkoxy.

It will be evident that the photosensitive plastic compositions of the present invention which are characterized by having a photosensitive compound dispersed in a polymeric plastic material are of particular value because they provide a more direct and convenient means for making photographic materials and photo reproductions. Thus, the photosensitive compositions of the present invention eliminate the necessity of applying a photosensitive coating to a film base and avoid processing the film in a dark room by an involved developing procedure in order to obtain a satisfactory image.

Although the invention has been described in considerable detail with particular reference to certain preferred embodiments thereof, variations and modifications can be effected within the spirit and scope of the invention as described hereinbefore and as defined in the appended claims.

I claim:

1. A process for photoreproduction which comprises imagewise exposing to ultraviolet radiation an element comprising:

a polymeric plastic material selected from the group consisting of cellulose esters and polyolefins derived from monomers having 2 to 4 carbon atoms, said polymeric plastic material having incorporated therein a photosensitive compound having the structural formula

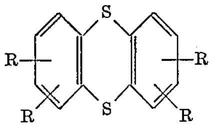

where each R is a substituent independently selected from the group consisting of H, OH, SH, $NO_2$, alkyl, alkoxy, carboxy and carbamyloxy, to transform the photosensitive compound in exposed areas from an essentially colorless form into a form having a visible color.

2. A process as defined in claim 1 wherein the photosensitive compound is thianthrene having the structural formula

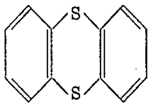

3. A process as defined in claim 1 wherein the polymeric plastic material is polypropylene.

4. A process as defined in claim 1 wherein the polymeric plastic material is cellulose acetate butyrate.

5. A process for photoreproduction which comprises imagewise exposing to ultraviolet radiation an element comprising polypropylene having incorporated therein thianthrene having the structural formula

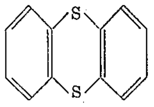

to transform the thianthrene in exposed areas from an essentially colorless form into a form having a visible color.

References Cited

UNITED STATES PATENTS

| | | | |
|---|---|---|---|
| 2,426,894 | 9/1947 | McQueen | 96—90 |
| 2,676,939 | 4/1954 | Hahn et al. | 260—45.8 |
| 3,134,674 | 5/1964 | Brown | 96—90 |
| 3,212,898 | 10/1965 | Cerreta | 96—90 |

FOREIGN PATENTS

| | | |
|---|---|---|
| 632,080 | 5/1963 | Belgium. |

OTHER REFERENCES

Bradley, A., et al.: (II) "Photoconductivity in Thin Organic Films," J. Electrochem Soc., 110, pp. 543–8 (1963).

Bradley, A., et al.: (I) "Electrical Properties of Thin Organic Films," J. Electrochem Soc., 110, pp. 15–22 (1963).

Condensed Chemical Dictionary, 1961, p. 917.

Kosar, J.: Light-Sensitive Systems, 1965, p. 366.

J. TRAVIS BROWN, *Acting Primary Examiner.*

NORMAN G. TORCHIN, *Examiner.*

C. E. DAVIS, *Assistant Examiner.*